(12) United States Patent
Sawahara

(10) Patent No.: US 11,601,108 B2
(45) Date of Patent: Mar. 7, 2023

(54) ISOLATOR AND COMMUNICATION SYSTEM

(71) Applicants: Kabushiki Kaisha Toshiba, Tokyo (JP); Toshiba Electronic Devices & Storage Corporation, Tokyo (JP)

(72) Inventor: Yuichi Sawahara, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 1059 days.

(21) Appl. No.: 16/274,680

(22) Filed: Feb. 13, 2019

(65) Prior Publication Data

US 2020/0075229 A1   Mar. 5, 2020

(30) Foreign Application Priority Data

Aug. 29, 2018  (JP) .............................. JP2018-160692

(51) Int. Cl.
*H03H 7/01* (2006.01)
*H01L 23/64* (2006.01)
(Continued)

(52) U.S. Cl.
CPC ............ *H03H 7/0115* (2013.01); *H01G 4/40* (2013.01); *H01L 23/5223* (2013.01); *H01L 23/642* (2013.01); *H01L 23/645* (2013.01); *H01F 2038/146* (2013.01); *H01L 23/5227* (2013.01); *H03H 2001/0085* (2013.01)

(58) Field of Classification Search
CPC ......... H03H 7/0115; H03H 2001/0085; H01G 4/40; H01L 23/5223; H01L 23/645; H01L 23/5227; H01F 2038/146
See application file for complete search history.

(56) References Cited

U.S. PATENT DOCUMENTS 7,289,553 B2   10/2007   Yukutake et al.
9,748,938 B2   8/2017    Kawai
(Continued)

FOREIGN PATENT DOCUMENTS

JP    2000-250710 A        9/2000
JP    2003283284 A  *     10/2003
(Continued)

*Primary Examiner* — Dinh T Le
(74) *Attorney, Agent, or Firm* — Allen & Overy LLP

(57) ABSTRACT

According to one embodiment, in an isolator, a first capacitive element is arranged on a first signal line. The first capacitive element has one end electrically connected to an input side circuit and having another end electrically connected to an output side circuit. A second capacitive element is arranged on a second signal line. The second capacitive element having one end electrically connected to the input side circuit and having another end electrically connected to the output side circuit. A first inductive element has one end electrically connected to a first node between the first capacitive element in the first signal line and the output side circuit. A second inductive element has one end electrically connected to a second node between the second capacitive element in the second signal line and the output side circuit.

11 Claims, 12 Drawing Sheets

(51) Int. Cl.
*H01L 23/522* (2006.01)
*H01G 4/40* (2006.01)
*H01F 38/14* (2006.01)
*H03H 1/00* (2006.01)

(56) References Cited

U.S. PATENT DOCUMENTS

| | | | |
|---|---|---|---|
| 2009/0068963 A1* | 3/2009 | Cabanillas | H04B 1/52 455/83 |
| 2009/0327558 A1 | 12/2009 | Landry et al. | |
| 2016/0261256 A1 | 9/2016 | Kawai | |

FOREIGN PATENT DOCUMENTS

| | | |
|---|---|---|
| JP | 4431208 B2 | 3/2010 |
| JP | 2013-232719 A | 11/2013 |
| JP | 2014-53765 A | 3/2014 |
| WO | 2016/079798 A1 | 5/2016 |

\* cited by examiner

ISOLATOR AND COMMUNICATION SYSTEM

CROSS-REFERENCE TO RELATED APPLICATIONS

This application is based upon and claims the benefit of priority from Japanese Patent Application No. 2018-160692, filed on Aug. 29, 2018; the entire contents of which are incorporated herein by reference.

FIELD

Embodiments described herein relate generally to an isolator and a communication system.

BACKGROUND

A capacitively coupled type isolator is configured by electrically inserting a capacitive element on a signal line between an input side circuit and an output side circuit. At this time, it is desired to appropriately perform signal transmission from the input side circuit to the output side circuit through the capacitive element.

DETAILED DESCRIPTION

Figure 1:
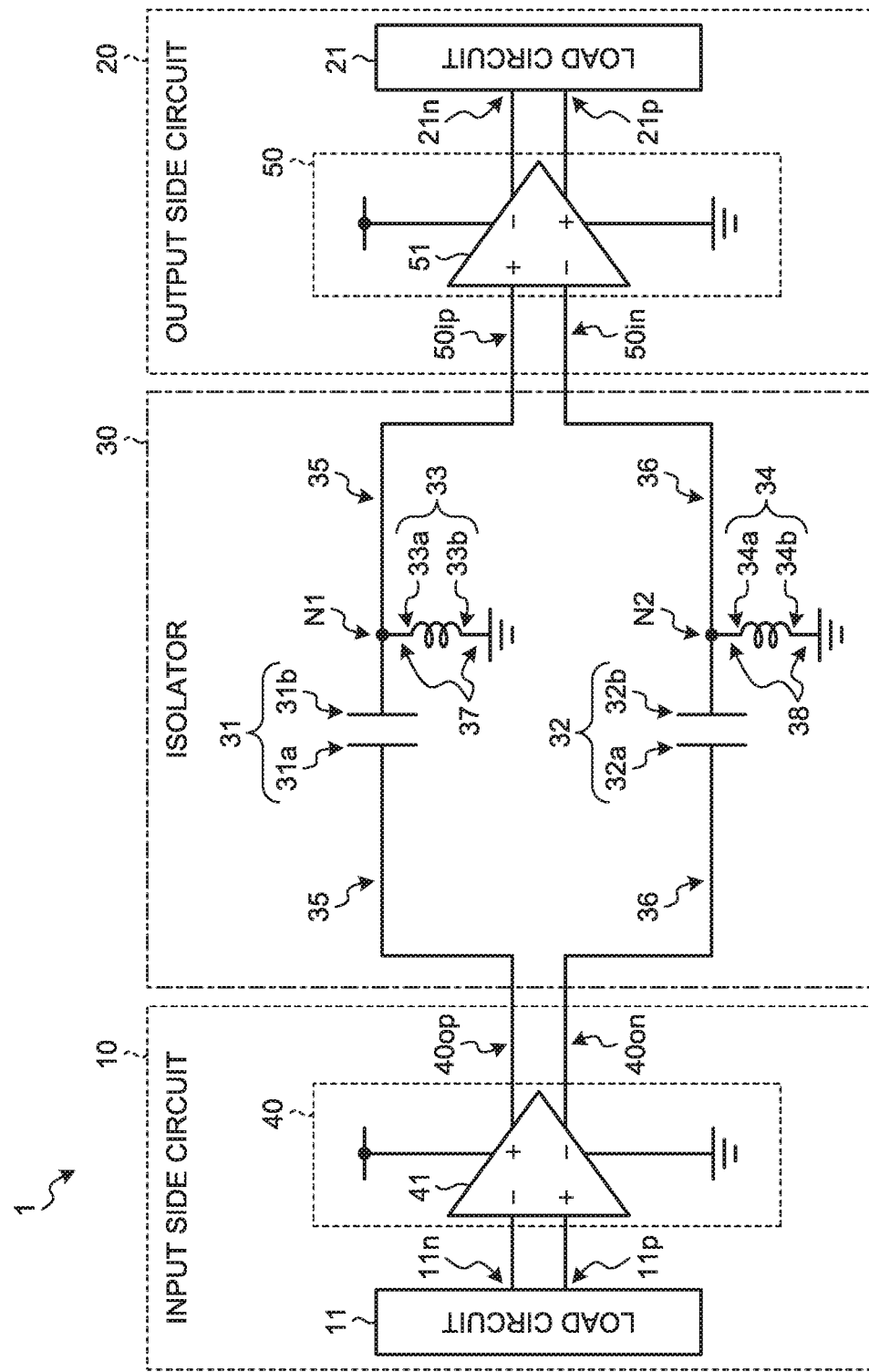
FIG. 1 is a circuit diagram illustrating a configuration of a communication system including an isolator according to an embodiment.

In general, according to one embodiment, there is provided an isolator including a first signal line, a second signal line, a first capacitive element, a second capacitive element, a first inductive element, and a second inductive element. The first signal line is disposed between an input side circuit and an output side circuit. The second signal line is disposed between the input side circuit and the output side circuit and constituting a differential a pair with the first signal line. The first capacitive element is arranged on the first signal line. The first capacitive element has one end electrically connected to the input side circuit and having another end electrically connected to the output side circuit. The second capacitive element is arranged on the second signal line. The second capacitive element having one end electrically connected to the input side circuit and having another end electrically connected to the output side circuit. The first inductive element has one end electrically connected to a first node between the first capacitive element in the first signal line and the output side circuit. The second inductive element has one end electrically connected to a second node between the second capacitive element in the second signal line and the output side circuit.

Exemplary embodiments of an isolator will be explained below in detail with reference to the accompanying drawings. The present invention is not limited to the following embodiments.

Embodiment

An isolator according to an embodiment will be described. The isolator is used to transmit signals while electrically isolating an input side circuit and an output side circuit.

On the other hand, with market demands such as high-temperature operation, high-speed communication, and long life cycle, replacement of an optically coupled type isolator with a capacitively coupled type isolator is required. An isolator other than the optically coupled type isolator is sometimes called a digital isolator, and a capacitively coupled type isolator is a kind of a digital isolator. The capacitively coupled type isolator performs signal transmission by using a capacitive element including electrodes disposed to face each other. That is, the capacitively coupled type isolator is configured by electrically inserting a capacitive element on each of a pair of differential signal lines between an input side circuit and an output side circuit.

In this configuration, an electric field is generated between the electrodes of the capacitive element, which are disposed to face each other, by a differential voltage input to the input side circuit, and the differential voltage is transmitted from the electrode of the capacitive element to the output side circuit. At this time, a portion of the voltage which is to be transmitted from the electrode of the capacitive element to the output side circuit may leak to a ground potential due to a parasitic ground capacitance of the electrode of the capacitive element, and thus, there is a possibility that in-phase noise is mixed into each of the pair of the differential signals. If the in-phase noise is mixed into each of the pair of differential signals, the mixing of the in-phase noise becomes a main cause of EMI noise (electromagnetic noise), and thus, there is a possibility that proper signal transmission from the input side circuit to the output side circuit through the capacitive element becomes difficult.

Therefore, in the present embodiment, in a capacitively coupled type isolator, inductive elements are each electrically inserted between a pair of differential signal lines extending from the electrode of the capacitive element to the output side circuit and the ground potential, in order to suppress the influence of the parasitic ground capacitance and to reduce the transmission loss of the signal.

More specifically, the communication system 1 including the isolator 30 may be configured as illustrated in FIG. 1. FIG. 1 is a diagram illustrating a configuration of the communication system 1 including the isolator 30.

The communication system 1 includes an input side circuit 10, an output side circuit 20, and an isolator 30. The isolator 30 is disposed between the input side circuit 10 and the output side circuit 20. The isolator 30 is a capacitively coupled type isolator and capacitively couples the input side circuit 10 and the output side circuit 20 while electrically insulating the input side circuit 10 and the output side circuit 20.

The input side circuit 10 has a load circuit 11 and a transmission circuit 40. The output side circuit 20 has a reception circuit 50 and a load circuit 21. For example, in a case where an operating voltage of a motor is monitored by a controller, the input side circuit 10 becomes a high voltage region, the output side circuit 20 becomes a low voltage region, the load circuit 11 includes the motor and an inverter circuit, and the load circuit 21 includes the controller. For example, in a case where the controller controls the operation of the motor, the input side circuit 10 becomes the low voltage region, the output side circuit 20 becomes the high voltage region, the load circuit 11 includes the controller, and the load circuit 21 includes the motor and the inverter circuit. In any case, each of the load circuit 11, the transmission circuit 40, the reception circuit 50, and the load circuit 21 is formed in a differential configuration.

The transmission circuit 40 has a differential amplifier 41. The differential amplifier 41 is a differential input/differential output type differential amplifier. The non-inversion input terminal (+) is electrically connected to a P-side node 11p of the load circuit 11, the inversion input terminal (−) is electrically connected to an N-side node 11n of the load circuit 11, the non-inversion output terminal (+) is electrically connected to a P-side input node 30ip of the isolator 30, and the inversion output terminal (−) is electrically connected to an N-side input node 30in of the isolator 30.

The reception circuit 50 has a differential amplifier 51. The differential amplifier 51 is a differential input/differential output type differential amplifier. The non-inversion input terminal (+) is electrically connected to a P-side output node 30op of the isolator 30, the inversion input terminal (−) is electrically connected to an N-side output node 30on the isolator 30, the non-inversion output terminal (+) is electrically connected to a P-side node 21p of the load circuit 21, and the inversion output terminal (−) is electrically connected to an N-side node 21n of the load circuit 21.

The isolator 30 can be an isolator corresponding to a differential configuration. The isolator 30 converts the pair of differential voltages transmitted from the input side circuit 10 into a pair of electric field energies, re-converts the pair of electric field energies into a pair of differential voltages, and transmits the pair of differential voltages to the output side circuit 20.

In a case where the required withstand voltage (for example, 5 kV) between the electrode connected to the transmission circuit 40 and the electrode connected to the reception circuit 50 can be satisfied by using a single insulating film, the isolator 30 may be configured as a single insulation type. For example, the isolator 30 includes a signal line 35, a signal line 36, a capacitive element 31, a capacitive element 32, an inductive element 33, and an inductive element 34. The signal line 35, the capacitive element 31, and the inductive element 33 correspond to the differential P side, and the signal line 36, the capacitive element 32, and the inductive element 34 correspond to the differential N side.

The signal line 35 is disposed between the input side circuit 10 and the output side circuit 20. The signal line 35 together with the signal line 36 constitutes a differential pair. One end of the signal line 35 is electrically connected to the input side circuit 10, and the other end is electrically connected to the output side circuit 20.

The signal line 36 is disposed between the input side circuit 10 and the output side circuit 20. The signal line 36 together with the signal line 35 constitutes a differential pair. One end of the signal line 36 is electrically connected to the input side circuit 10, and the other end is electrically connected to the output side circuit 20.

The capacitive element 31 is arranged on the signal line 35. One end 31a of the capacitive element 31 is electrically connected to a P-side output node 40op of the transmission circuit 40, and the other end 31b is electrically connected to a P-side input node 50ip of the reception circuit 50. The capacitive element 31 can be, for example, a capacitor.

The capacitive element 32 is arranged on the signal line 36. One end 32a of the capacitive element 32 is electrically connected to an N-side output node 40on of the transmission circuit 40, and the other end 32b is electrically connected to an N-side input node 50in of the reception circuit 50. The capacitive element 32 can be, for example, a capacitor.

One end 33a of the inductive element 33 is electrically connected to a node N1, and the other end 33b is electrically connected to the ground potential. The node N1 is a node between the other end 31b of the capacitive element 31 and the P-side input node 50ip of the reception circuit 50.

One end 34a of the inductive element 34 is electrically connected to a node N2 and the other end 34b is electrically connected to the ground potential. The node N2 is a node between the other end 32b of the capacitive element 32 and the N-side input node 50in of the reception circuit 50.

Figure 2:
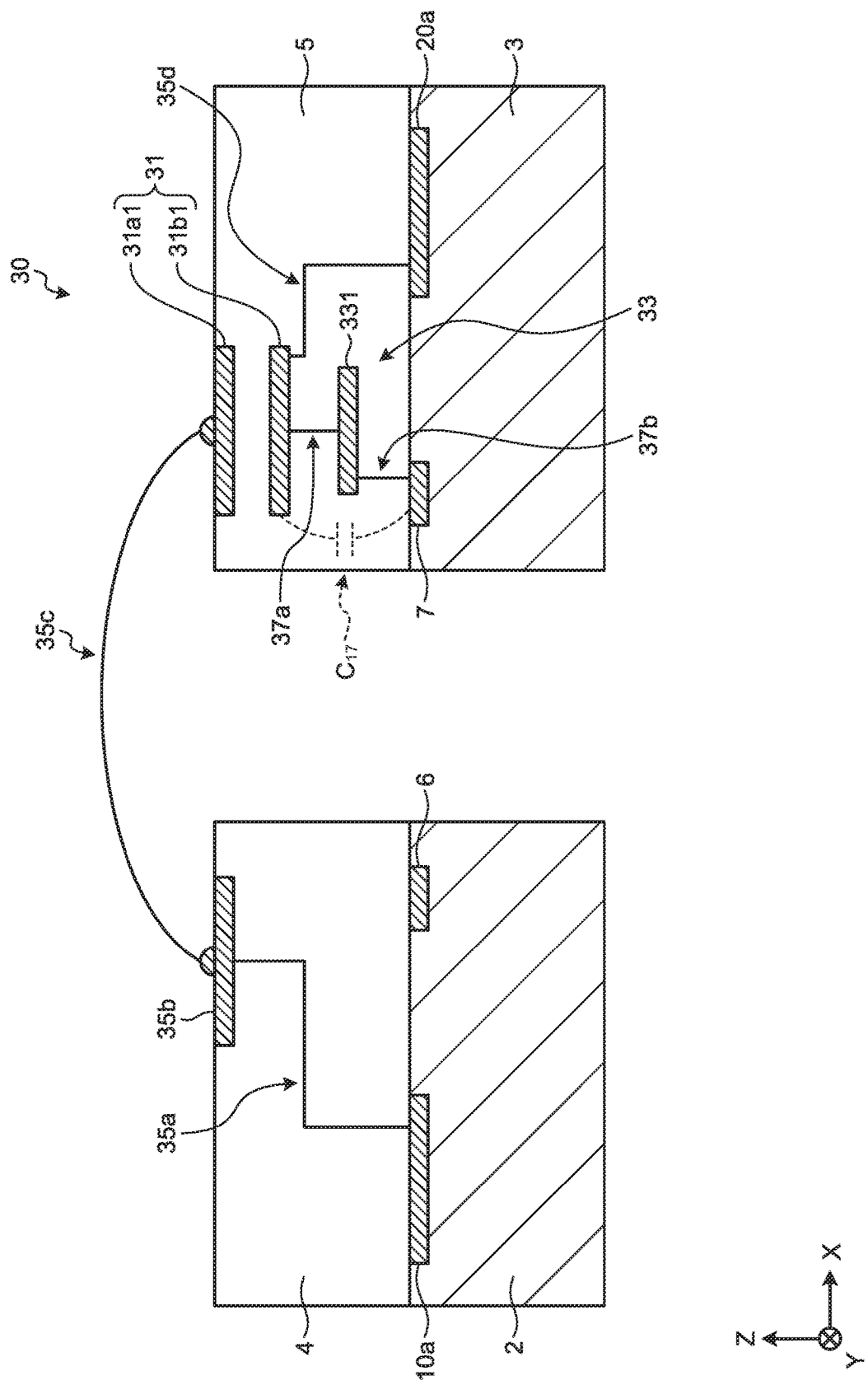
FIG. 2 is a cross-sectional view illustrating a mounting configuration of the isolator according to the embodiment.
Figure 3:
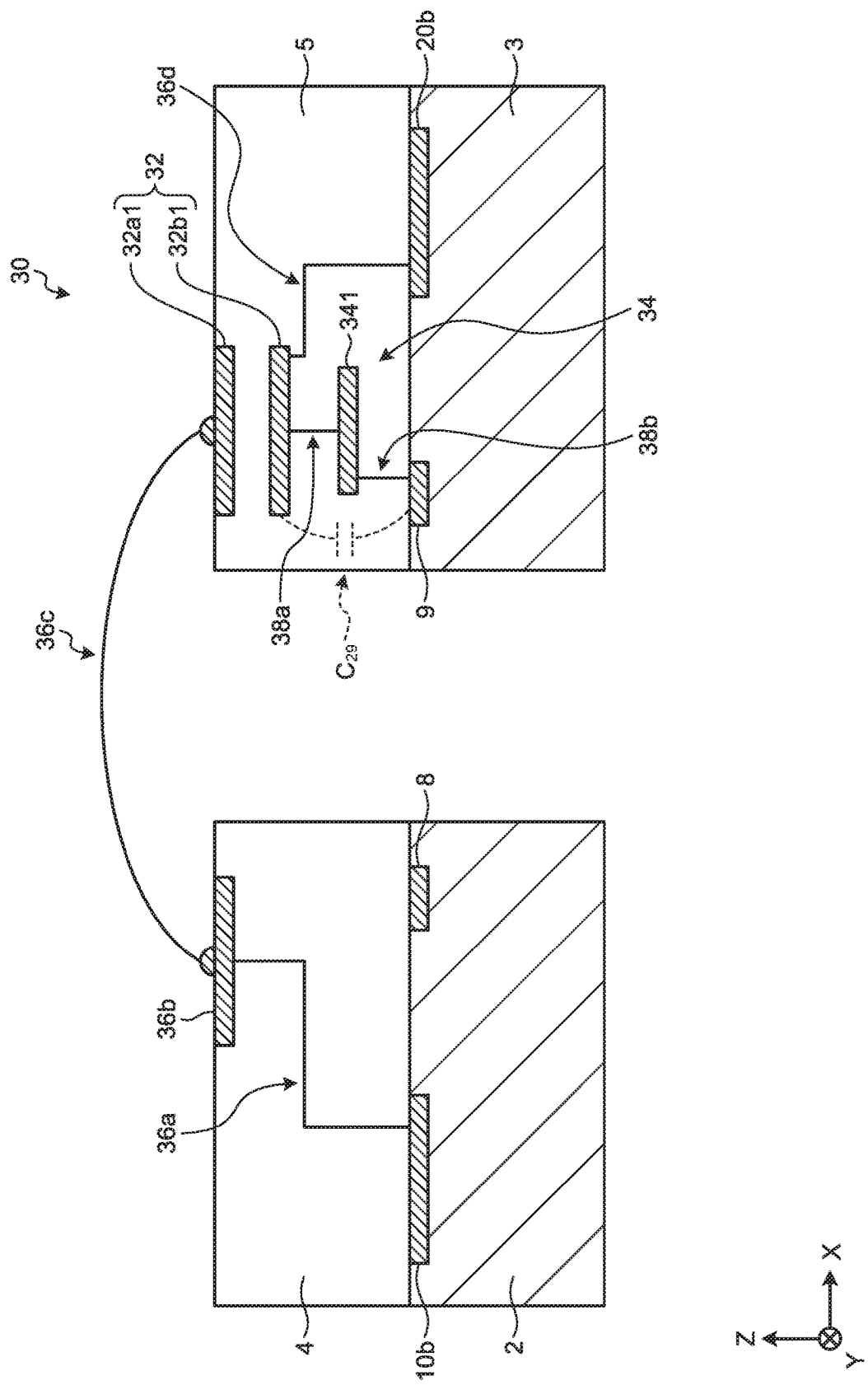
FIG. 3 is a cross-sectional view illustrating the mounting configuration of the isolator according to the embodiment.
Figure 4:
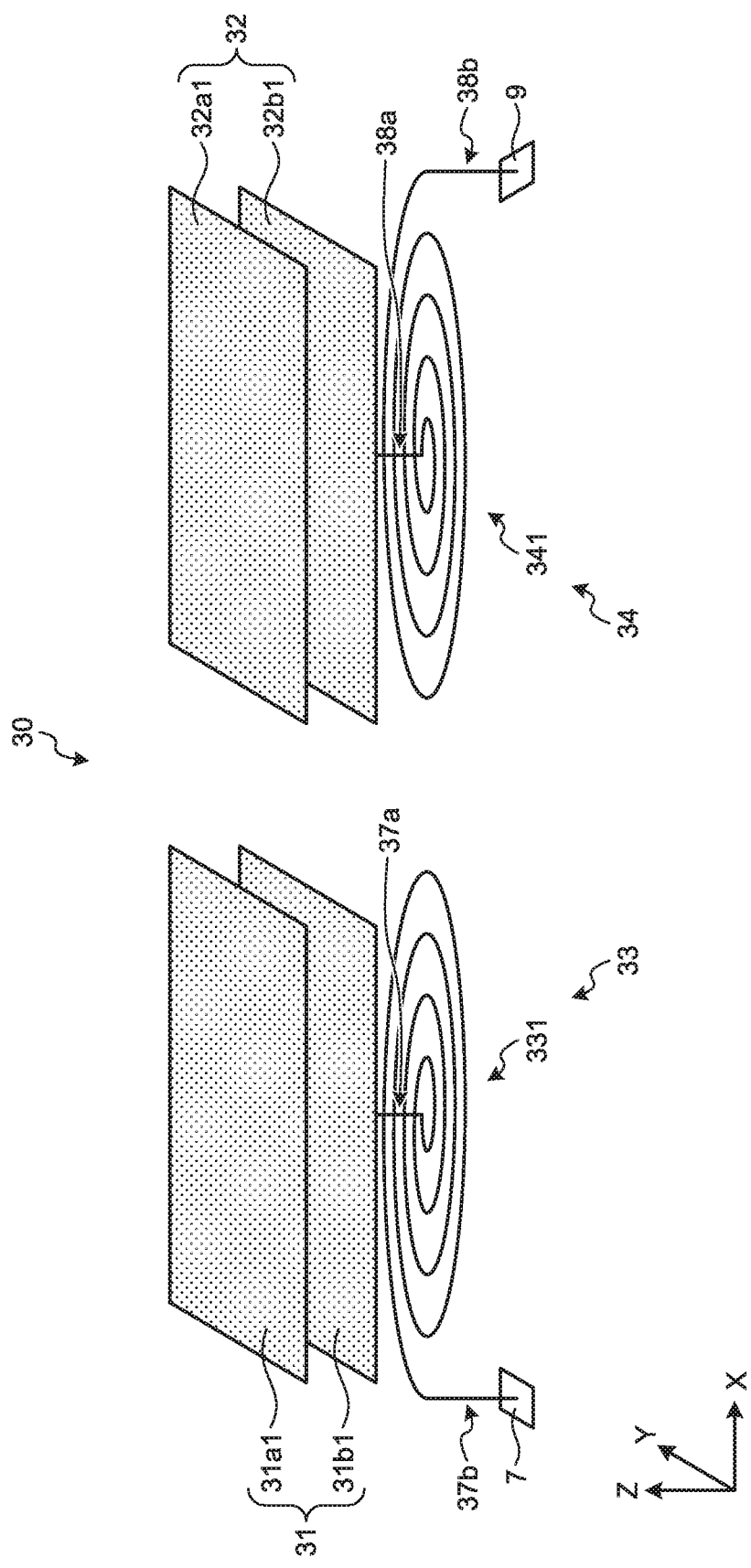
FIG. 4 is a perspective view illustrating the mounting configuration of the isolator according to the embodiment.

The isolator 30 illustrated in FIG. 1 may be mounted as illustrated in, for example, FIGS. 2 to 4. FIG. 2 is a cross-sectional view illustrating the mounting configuration of the isolator 30 and illustrates cross sections corresponding to the capacitive element 31 and the inductive element 33. FIG. 3 is a cross-sectional view illustrating the mounting configuration of the isolator 30 and illustrates cross sections corresponding to the capacitive element 32 and the inductive element 34. FIG. 4 is a perspective view illustrating the mounting configuration of the isolator 30. In FIGS. 2 to 4, a direction perpendicular to the surface of the substrate 2 is defined as a Z direction, and two directions orthogonal to each other in a plane perpendicular to the Z direction are defined as an X direction and a Y direction. In FIG. 4 for simplification of illustration, portions of the configurations in FIGS. 2 and 3 are illustrated.

An electrode 10a illustrated in FIG. 2 corresponds to the output node 40op in the input side circuit 10. The electrode 10a is disposed on the substrate 2. The ground pattern 6 is disposed on the substrate 2. The ground pattern 6 has a ground potential. The electrode 10a is electrically connected to an electrode 35b through wiring 35a. The electrode 35b is disposed in the +Z direction of the substrate 2 through an interlayer insulating film 4. The electrode 35b is electrically connected to an electrode 31a1 through a bonding wire 35c. The wiring 35a, the electrode 35b, and the bonding wire 35c correspond to a portion connecting the output node 40op in the signal line 35 and the one end 31a of the capacitive element 31.

The capacitive element 31 is disposed in the +Z direction of the substrate 3 through an interlayer insulating film 5. The capacitive element 31 has the electrode 31a1 and an electrode 31b1. The electrode 31a1 is disposed in the +Z direction of the electrode 31b1 and faces the electrode 31b1 through the interlayer insulating film 5. The electrode 31a1 functions as one end 31a (refer to FIG. 1) of the capacitive element 31. The electrode 31b1 functions as the other end 31b of the capacitive element 31. The electrode 31b1 is electrically connected to the electrode 20a through the wiring 35d. The electrode 20a corresponds to the input node 50ip in the output side circuit 20. The electrode 20a is disposed on the substrate 3.

The capacitive element 31 may be configured as a parallel plate type as illustrated in FIG. 1 with respect to the electrode 31a1 and the electrode 31b1. Each of the electrode 31a1 and the electrode 31b1 is configured in a plate shape, and the electrode 31a1 and the electrode 31b1 may be disposed to face each other. The electrode 31a1 may be configured in a rectangular shape in the XY plan view. The electrode 31a2 may be configured in a rectangular shape in the XY plan view.

The inductive element 33 illustrated in FIG. 2 is disposed between the substrate 3 and the capacitive element 31 in the Z direction. The inductive element 33 has a coil pattern 331. The coil pattern 331 is disposed between the ground pattern 7 and the capacitive element 31 in the Z direction. The coil pattern 331 extends in the X and Y directions. One end of the coil pattern 331 is electrically connected to the electrode 31b1 through wiring 37a, and the other end is electrically connected to the ground pattern 7 through wiring 37b. The ground pattern 7 is disposed on the substrate 3. The ground pattern 7 has a ground potential.

The coil pattern 331 illustrated in FIG. 2 may be configured as a spiral type as illustrated in FIG. 4. The coil pattern. 331 can be configured to extend in a spiral shape in the X and Y directions. A portion of the coil pattern 331 the vicinity of the center thereof is electrically connected to the electrode 31b1 through the wiring 37a, and a portion on the outer peripheral side thereof is electrically connected to the ground pattern 7 through the wiring 37b.

The electrode 10b illustrated in FIG. 3 corresponds to the output node 40on of the input side circuit 10. The electrode 10b is disposed on the substrate 2. The ground pattern 8 is disposed on the substrate 2. The ground pattern 8 has a ground potential. The electrode 10b is electrically connected to an electrode 36b through wiring 36a. The electrode 36b is disposed in the +Z direction of the substrate 2 through the interlayer insulating film 4. The electrode 36b is electrically connected to an electrode 32a1 through a bonding wire 36c. The wiring 36a, the electrode 36b, and the bonding wire 36c correspond to a portion connecting the output node 40on of the signal line 36 and the one end 32a of the capacitive element 32.

The capacitive element 32 is disposed in the +Z direction of the substrate 3 through the interlayer insulating film 5. The capacitive element 32 has the electrode 32a1 and an electrode 32b1. The electrode 32a1 is disposed in the +Z direction of the electrode 32b1 and faces the electrode 32b1 through the interlayer insulating film 5. The electrode 32a1 functions as one end 32a of the capacitive element 32. The electrode 32b1 functions as the other end 32b of the capacitive element 32. The electrode 32b1 is electrically connected to the electrode 20b through wiring 36d. The electrode 20b corresponds to the input node 50in of the output side circuit 20. The electrode 20b is disposed on the substrate 3.

The capacitive element 32 may be configured as a parallel plate type as illustrated in FIG. 4 with respect to the electrode 32a1 and the electrode 32b1. Each of the electrode 32a1 and the electrode 32b1 is configured in a plate shape, and the electrode 32a1 and the electrode 32b1 may be disposed to face each other. The electrode 32a1 may be configured in a rectangular shape in the XY plan view. The electrode 32a2 may be configured in a rectangular shape in the XY plan view.

The inductive element 34 illustrated in FIG. 3 is disposed between the substrate 3 and the capacitive element 32 in the Z direction. The inductive element 34 has a coil pattern 341. The coil pattern 341 is disposed between the ground pattern 9 and the capacitive element 32 in the Z direction. The coil pattern 341 extends in the X and Y directions. One end of the coil pattern 341 is electrically connected to the electrode 32b1 through wiring 38a, and the other end is electrically connected to the ground pattern 9 through wiring 38b. The ground pattern 9 is disposed on the substrate 3. The ground pattern 9 has a ground potential.

The coil pattern 341 illustrated in FIG. 3 may be configured as a spiral type as illustrated in FIG. 4. The coil pattern 341 can be configured to extend in a spiral shape in the X and Y directions. A portion of the coil pattern 341 in the vicinity of the center thereof is electrically connected to the electrode 32b1 through the wiring 38a, and a portion on the outer peripheral side thereof is electrically connected to the ground pattern 9 through the wiring 38b.

Incidentally, as illustrated in FIG. 4, the coil pattern 331 and the coil pattern 341 can be configured in spiral shapes reversely winding with each other. As a result, the magnetic influence of the coil pattern 331 and the coil pattern 341 can be suppressed.

Herein, as illustrated in FIG. 2, the electrode 31b1 of the capacitive element 31 may form a parasitic ground capacitance $C_{17}$ between the electrode 31b1 and the ground pattern 7. At this time, if it is assumed that the frequency of a signal (differential P-side signal) to be transmitted from the transmission circuit 40 to the reception circuit 50 through the capacitive element 31 is denoted by $f_P$, an inductance $L_{33}$ of the inductive element 33 may be determined so as to be expressed by the following Equation 1.

$$L_{33}=1/(4\pi^2 f_P^2 C_{17}) \quad \text{Equation 1}$$

With this configuration, a circuit including the inductive element 33 and the ground capacitance $C_{17}$ can be set to be in an equivalently opened state with respect to a signal having the frequency $f_P$. As a result, since a signal transmitted from the electrode 31b1 side (the node N1 side illustrated in FIG. 1) to the inductive element 33 side can be reflected to the electrode 31b1 side (the node N1 side), the influence of the parasitic ground capacitance $C_{17}$ can be suppressed, and the transmission loss of the signal to the reception circuit 50 can be reduced.

In addition, as illustrated in FIG. 3, the electrode 32b1 of the capacitive element 32 may form a parasitic ground capacitance $C_{29}$ between the electrode 32b1 and the ground pattern 9. At this time, if it is assumed that the frequency of a signal (differential N-side signal) to be transmitted from the transmission circuit 40 to the reception circuit 50 through the capacitive element 32 is denoted by $f_N$, an inductance $L_{34}$ of the inductive element 34 may be determined so as to be expressed by the following Equation 2.

$$L_{34}=1/(4\pi^2 f_N^2 C_{29}) \quad \text{Equation 2}$$

With this configuration, a circuit including the inductive element 34 and the ground capacitance $C_{29}$ can be set to be in an equivalently opened state with respect to a signal having the frequency $f_N$. As a result, since a signal transmitted from the electrode 32b1 side (the node N2 side illustrated in FIG. 1) to the inductive element 34 side can be reflected to the electrode 32b1 side (the node N2 side), the influence of the parasitic ground capacitance $C_{29}$ can be suppressed, and the transmission loss of the signal to the reception circuit 50 can be reduced.

As described above, in the isolator 30, the inductive elements 33 and 34 are electrically connected between the pair of differential signal lines extending from the electrodes 31b1 and 32b1 of the capacitive elements 31 and 32 to the output side circuit 20 and the ground potential. As a result, the influence of the parasitic ground capacitances $C_{17}$ and $C_{29}$ can be suppressed, so that the transmission loss of the signal through the isolator 30 can be easily reduced.

Each of the electrodes 31a1, 31b1, 32a1, and 32b1 in the capacitive elements 31 and 32 and the coil patterns 331 and 341 in the inductive elements 33 and 34 can be formed from any arbitrary conductive materials and may be formed from, for example, materials containing a metal as a main component. For example, each of the electrodes 31a1, 31b1, 32a1, and 32b1 in the capacitive elements 31 and 32 can be formed from a material containing a first metal (for example, aluminum) as a main component, and the coil patterns 331 and 341 in the inductive elements 33 and 34 can be formed from a material containing a second metal (for example, copper) as a main component. The second metal may has substantially the same conductivity as that of the first metal and may has different conductivity from that of the first metal. In a case where the second metal has lower conductivity than that of the first metal, it is possible to efficiently secure the inductance per unit area in the X and Y directions, even though the cost of the second metal is higher than that of the first metal.

Alternatively, each of the electrodes 31a1, 31b1, 32a1, and 32b1 in the capacitive elements 31 and 32 and the coil patterns 331 and 341 in the inductive elements 33 and 34 can be formed from arbitrary film thickness, respectively. For example, the electrodes 31a1, 31b1, 32a1, and 32b1 of the capacitive elements 31 and 32 can be formed from a first film thickness, and the coil patterns 331 and 341 of the inductive elements 33 and 34 can be formed a second film thickness. The second film thickness may be substantially the same as the first film thickness and may be different from the first film thickness. In a case where the second film thickness is larger than the first film thickness, it is possible to efficiently secure the inductance per unit area in the X and Y directions.

Figure 5:
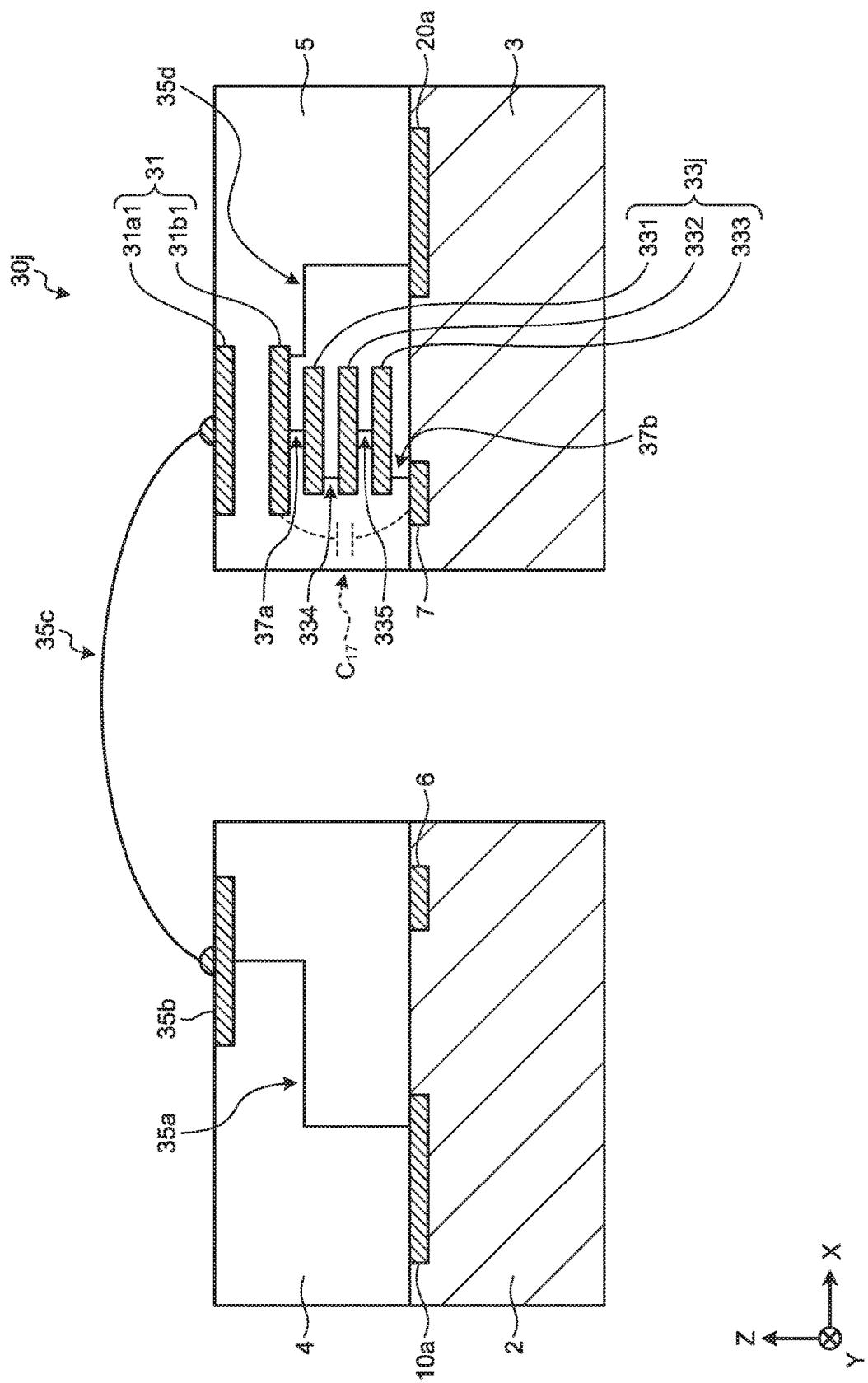
FIG. 5 is a cross-sectional view illustrating a mounting configuration of an isolator according to a first modified example of the embodiment.
Figure 6:
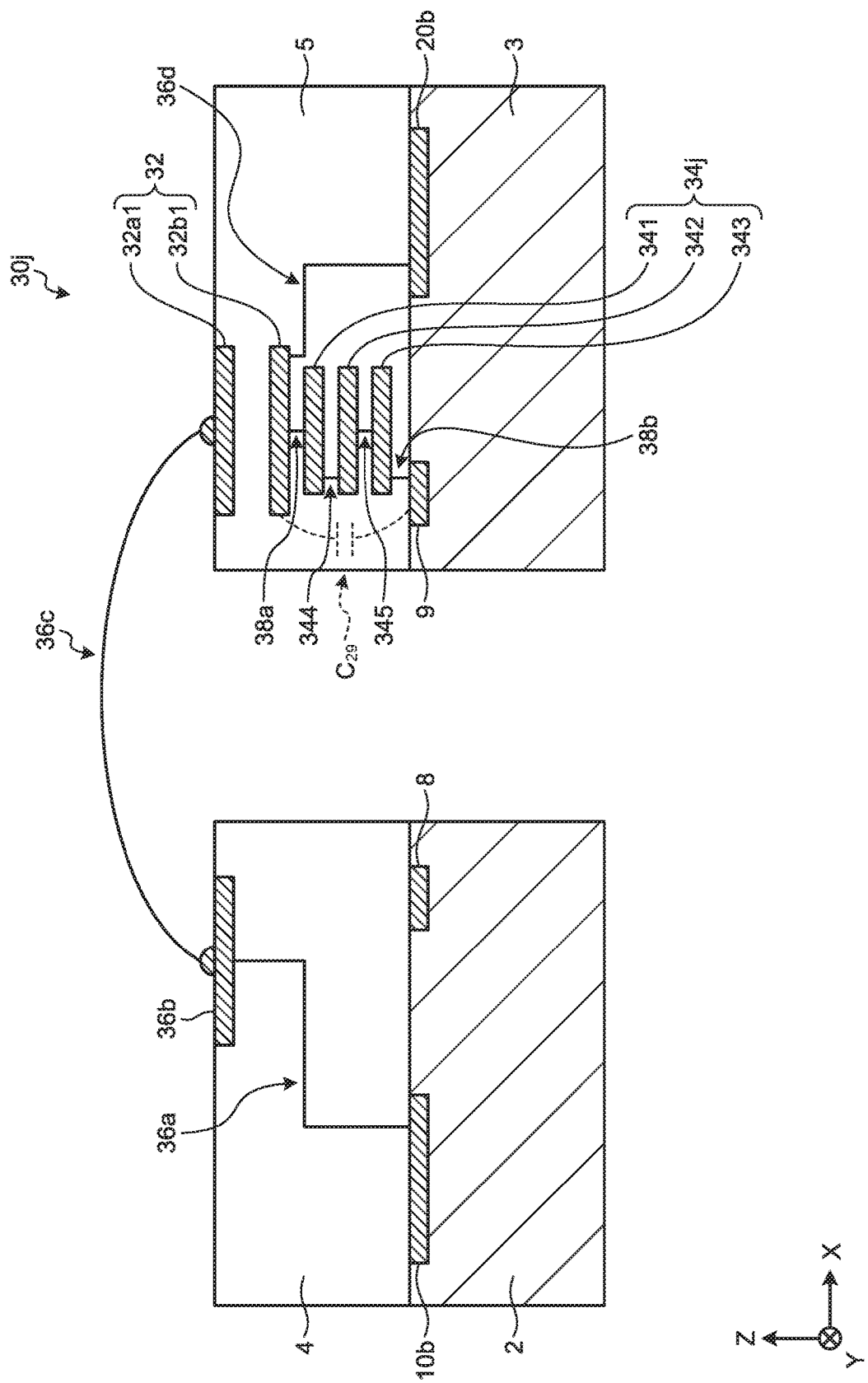
FIG. 6 is a cross-sectional view illustrating the mounting configuration of the isolator according to the first modified example of the embodiment.
Figure 7:
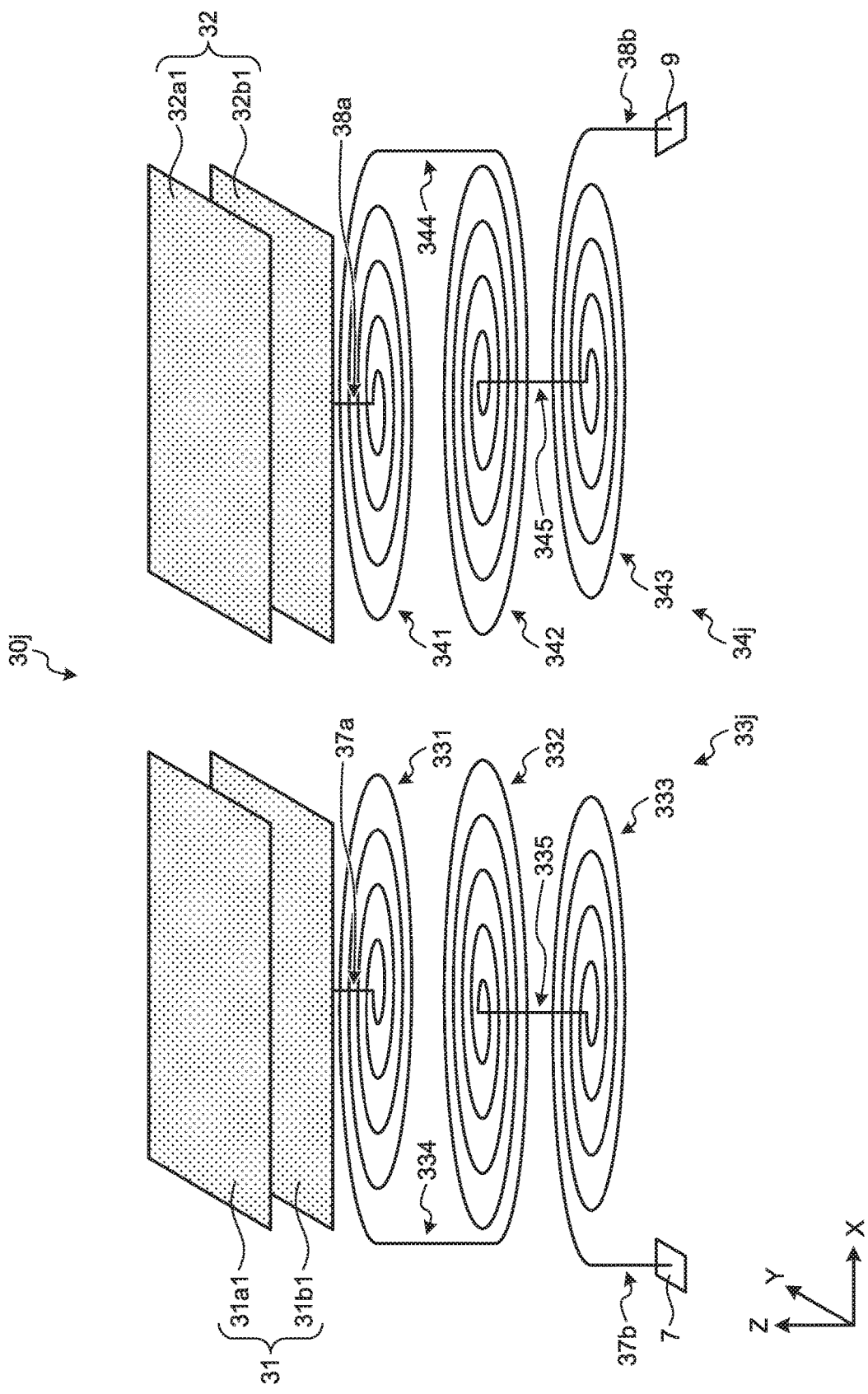
FIG. 7 is a perspective view illustrating the mounting configuration of the isolator according to the first modified example of the embodiment.

Alternatively, in an isolator 30j, as illustrated in FIGS. 5 to 7, inductive elements 33j and 34j may have a stacked structure. FIG. 5 is a cross-sectional view illustrating a mounting configuration of the isolator 30j and illustrates cross sections corresponding to the capacitive element 31 and the inductive element 33j. FIG. 6 is a cross-sectional view illustrating the mounting configuration of the isolator 30j and illustrates cross sections corresponding to the capacitive element 32 and the inductive element 34j. FIG. 7 is a perspective view illustrating the mounting configuration of the isolator 30j. In FIGS. 5 to 7, the direction perpendicular to the surface of the substrate 2 is defined as the Z direction, and the two directions orthogonal to each other in the plane perpendicular to the Z direction are defined as the X direction and the Y direction. In FIG. 7, for simplification of illustration, portions of the configurations in FIGS. 5 and 6 are illustrated.

The inductive element 33j illustrated in FIG. 5 further includes a coil pattern 332, a coil pattern 333, wiring 334, and wiring 335 in addition to the coil pattern 331.

The coil pattern 332 is disposed between the ground pattern 7 and the coil pattern 331 in the Z direction and is disposed between the coil pattern 333 and the coil pattern 331 in the Z direction. The coil pattern 332 extends in the X and Y directions. One end of the coil pattern 332 is electrically connected to the other end of the coil pattern 331 through the wiring 334, and the other end is electrically connected to one end of the coil pattern 333 through the wiring 335.

The coil pattern 333 is disposed between the ground pattern 7 and the coil patterns 331 and 332 in the Z direction. The coil pattern 333 extends in the X and Y directions. One end of the coil pattern 333 is electrically connected to the other end of the coil pattern 332 through the wiring 335, and the other end is electrically connected to the ground pattern 7 through the wiring 37b.

The plurality of coil patterns 331 to 333 illustrated in FIG. 5 may be configured as a stacked structure in which a spiral configuration as illustrated in FIG. 7 is stacked.

The coil pattern 331 can be configured to extend in a spiral shape in the X and Y directions. A portion of the coil pattern 331 in the vicinity of the center thereof is electrically connected to the electrode 31b1 through the wiring 37a, and a portion on the outer peripheral side thereof is electrically connected to the coil pattern 332 through the wiring 334.

The coil pattern 332 can be configured to extend in a spiral shape in the X and Y directions. A portion of the coil pattern 332 on the outer peripheral side thereof is electrically connected to the coil pattern 331 through wiring 334, and a portion in the vicinity of the center thereof is electrically connected to the coil pattern 333 through wiring 335.

The coil pattern. 333 can be configured to extend in a spiral shape in the X and Y directions. A portion of the coil pattern 333 in the vicinity of the center thereof is electrically connected to the coil pattern 332 through the wiring 335, and a portion on the outer peripheral side thereof is electrically connected to the ground pattern 7 through the wiring 37b.

As another embodiment, the inductive element 33j is not limited to have the coil pattern 332 and the coil pattern 333, but the inductive element 33j may have one coil pattern and may have three or more coil pattern.

The inductive element. 34j illustrated in FIG. 6 further includes a coil pattern 342, a coil pattern 343, wiring 344, and wiring 345 in addition to the coil pattern 341.

The coil pattern 342 is disposed between the ground pattern 9 and the coil pattern 341 in the Z direction and is disposed between the coil pattern 343 and the coil pattern 341 in the Z direction. The coil pattern 342 extends in the X and Y directions. One end of the coil pattern 342 is electrically connected to the other end of the coil pattern 341 through the wiring 344, and the other end is electrically connected to one end of the coil pattern 343 through the wiring 345.

The coil pattern 343 is disposed between the ground pattern 9 and the coil pattern 341 in the Z direction and is disposed between the ground pattern 9 and the coil pattern 342 in the Z direction. The coil pattern 343 extends in the X and Y directions. One end of the coil pattern 343 is electrically connected to the other end of the coil pattern 342 through the wiring 345, and the other end is electrically connected to the ground pattern 9 through the wiring 38b.

The plurality of coil patterns 341 to 343 illustrated in FIG. 6 may be configured as a stacked structure in which a spiral structure as illustrated in FIG. 7 is stacked.

The coil pattern 341 can be configured to extend in a spiral shape in the X and Y directions. A portion of the coil pattern 341 in the vicinity of the center thereof is electrically connected to the electrode 31b1 through the wiring 38a, and a portion on the outer peripheral side thereof is electrically connected to the coil pattern 342 through the wiring 344.

The coil pattern 342 can be configured to extend in a spiral shape in the X and Y directions. A portion of the coil pattern 342 on the outer peripheral side thereof is electrically connected to the coil pattern 341 through wiring 344, and a portion in the vicinity of the center thereof is electrically connected to the coil pattern 343 through wiring 345.

The coil pattern 343 can be configured to extend in a spiral shape in the X and Y directions. A portion of the coil pattern 343 in the vicinity of the center thereof is electrically connected to the coil pattern 342 through the wiring 345, and a portion on the outer peripheral side thereof is electrically connected to the ground pattern 9 through the wiring 38b.

As another embodiment, the inductive element 34j is not limited to have the coil pattern 342 and the coil pattern 343, but the inductive element 34j may have one coil pattern and may have three or more coil pattern.

It should be noted that coil patterns 332 and coil patterns 342 can be configured in spiral shapes reversely winding with each other and that coil patterns 333 and coil patterns 343 can be configured in spiral shapes reversely winding with each other. As a result, the magnetic influence of the coil pattern 332 and the coil pattern 342 can be suppressed and the magnetic influence of the coil pattern 333 and the coil pattern 343 can be suppressed.

In this manner, by mounting the inductive elements 33j and 34j of the isolator 30j with a stacked structure, it is possible to efficiently secure the inductance per unit area in the X and Y directions. As a result, it is possible to reduce the mounting area of the coil patterns 331 to 333 and 341 to 343 in the X and Y directions for obtaining the inductances 133 and 134 expressed by, for example, Equations 1 and 2, so that it is possible to easily improve the mounting density of the isolators 30j.

Figure 8:
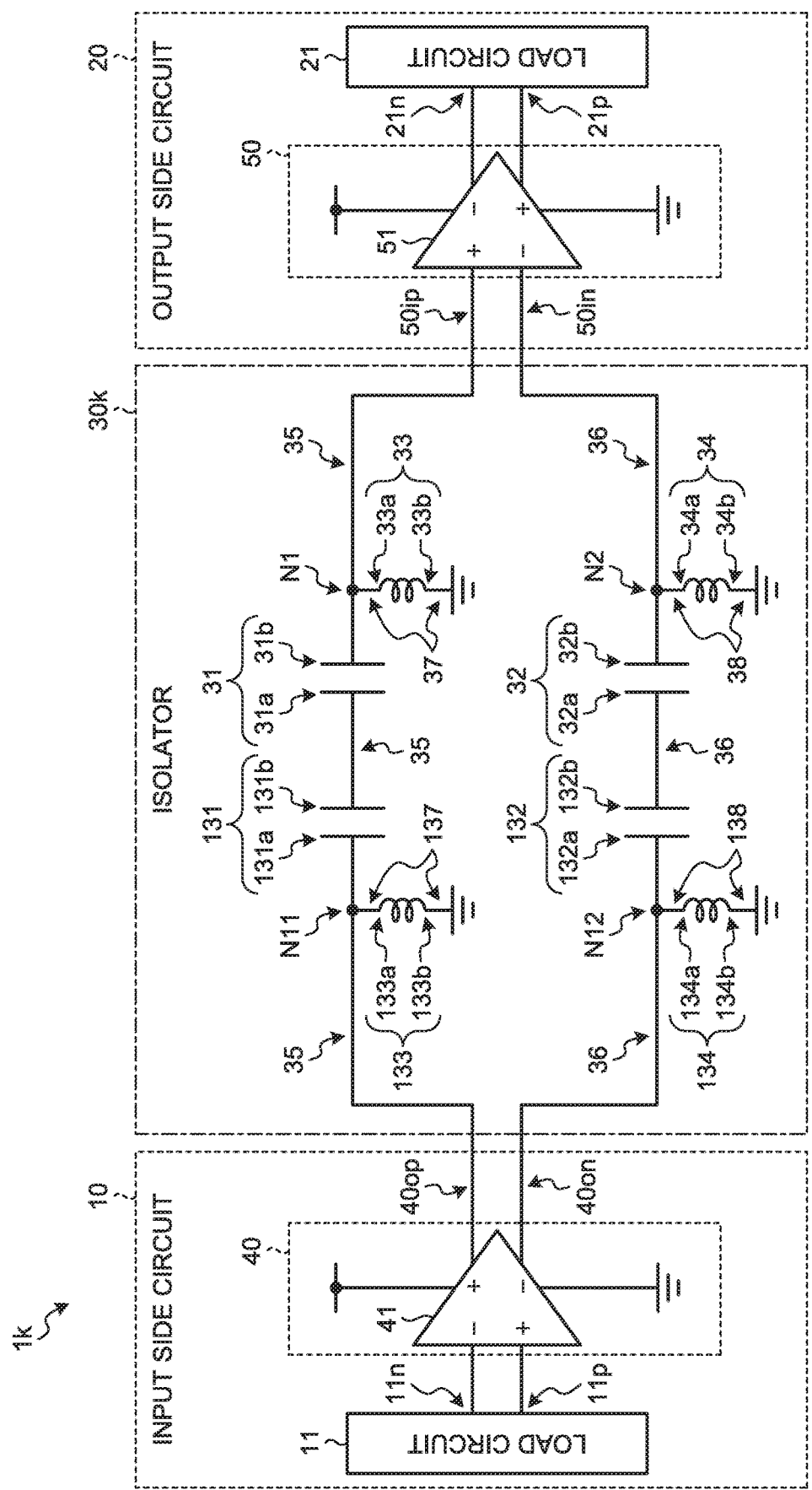
FIG. 8 is a circuit diagram illustrating a configuration of a communication system including an isolator according to a second modified example of the embodiment.

Alternatively, in a case where it is difficult for a single insulating film to satisfy the required withstand voltage (for example, 5 kV) between the coil connected to the transmission circuit and the coil connected to the reception circuit, the isolator 30k may be configured as a double insulation type. For example, a communication system 1k including the isolator 30k may be configured as illustrated in FIG. 8. FIG. 8 is a circuit diagram illustrating a configuration of the communication system 1k including the isolator 30k according to a second modified example of the embodiment.

The communication system 1k has the isolator 30k in place of the isolator 30 (refer to FIG. 1). The isolator 30k further includes a capacitive element 131, a capacitive element 132, an inductive element 133, and an inductive element 134. The signal line 35, the capacitive element 131, the inductive element 133, the capacitive element 31, and the inductive element 33 correspond to the differential P side, and the signal line 36, the capacitive element 132, the inductive element 134, the capacitive element 32, and the inductive element 34 correspond to the differential N side.

The capacitive element 131 is disposed between the transmission circuit 40 and the capacitive element 31 and is arranged on the signal line 35. One end 131a of the capacitive element 131 is electrically connected to the P-side output node 40op of the transmission circuit 40, and the other end 131b is electrically connected to one end 31a of the capacitive element 31. The capacitive element 131 can be, for example, a capacitor.

The capacitive element 132 is disposed between the transmission circuit 40 and the capacitive element 32 and is arranged on the signal line 36. One end 132a of the capacitive element 132 is electrically connected to the N-side output node 40on of the transmission circuit 40, and the other end 132b is electrically connected to the one end 32a of the capacitive element 32. The capacitive element 32 can be, for example, a capacitor.

One end 133a of the inductive element 133 is electrically connected to a node N11, and the other end 133b is electrically connected to the ground potential. The node N11 is a node between the P-side output node 40op of the transmission circuit 40 and the one end 131a of the capacitive element 131.

One end 134a of the inductive element 134 is electrically connected to a node N12, and the other end 134b is electrically connected to the ground potential. The node N12 is a node between the N-side output node 40on of the transmission circuit 40 and the one end 132a of the capacitive element 132.

Figure 9:
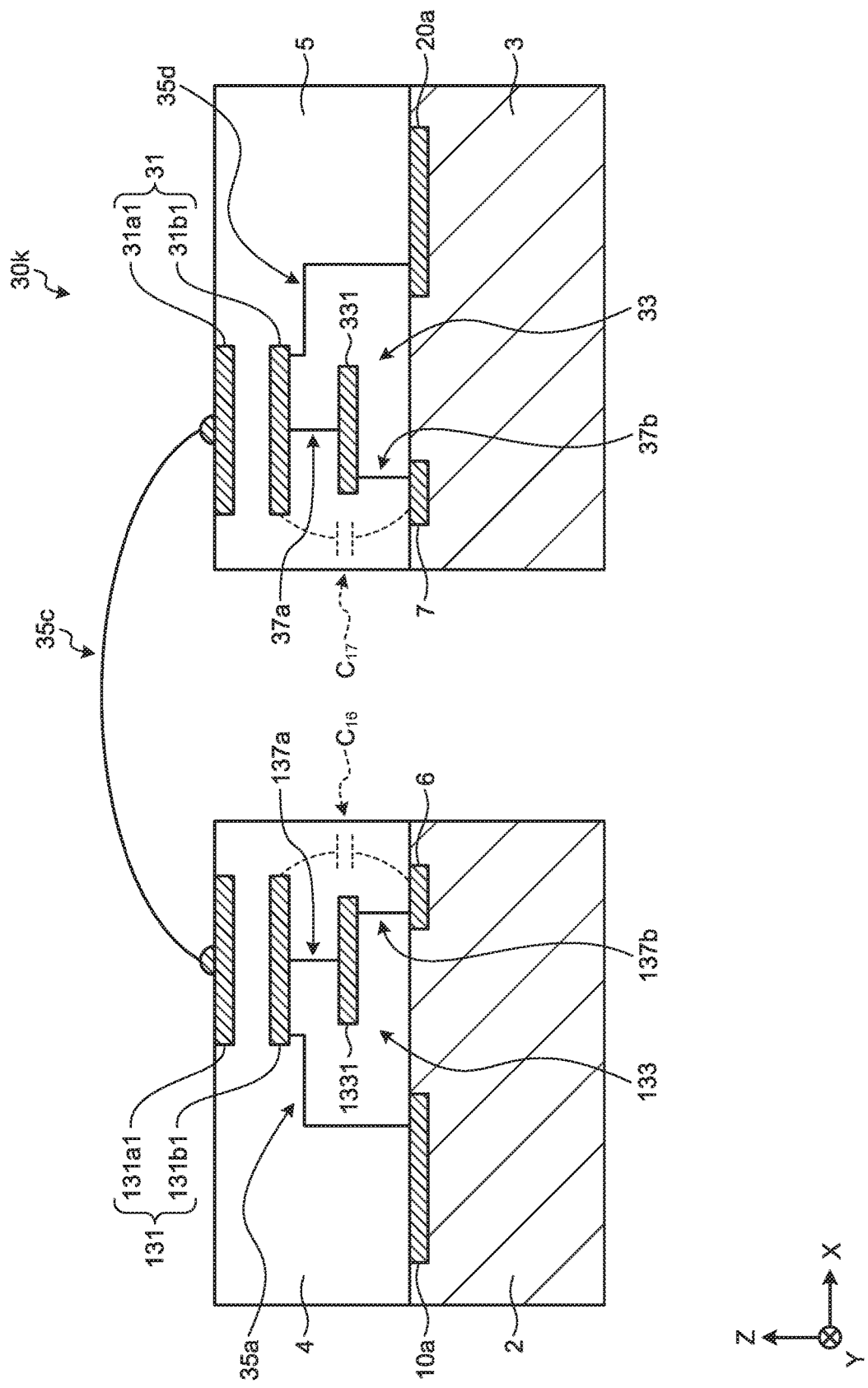
FIG. 9 is a cross-sectional view illustrating a mounting configuration of an isolator according to the second modified example of the embodiment.
Figure 10:
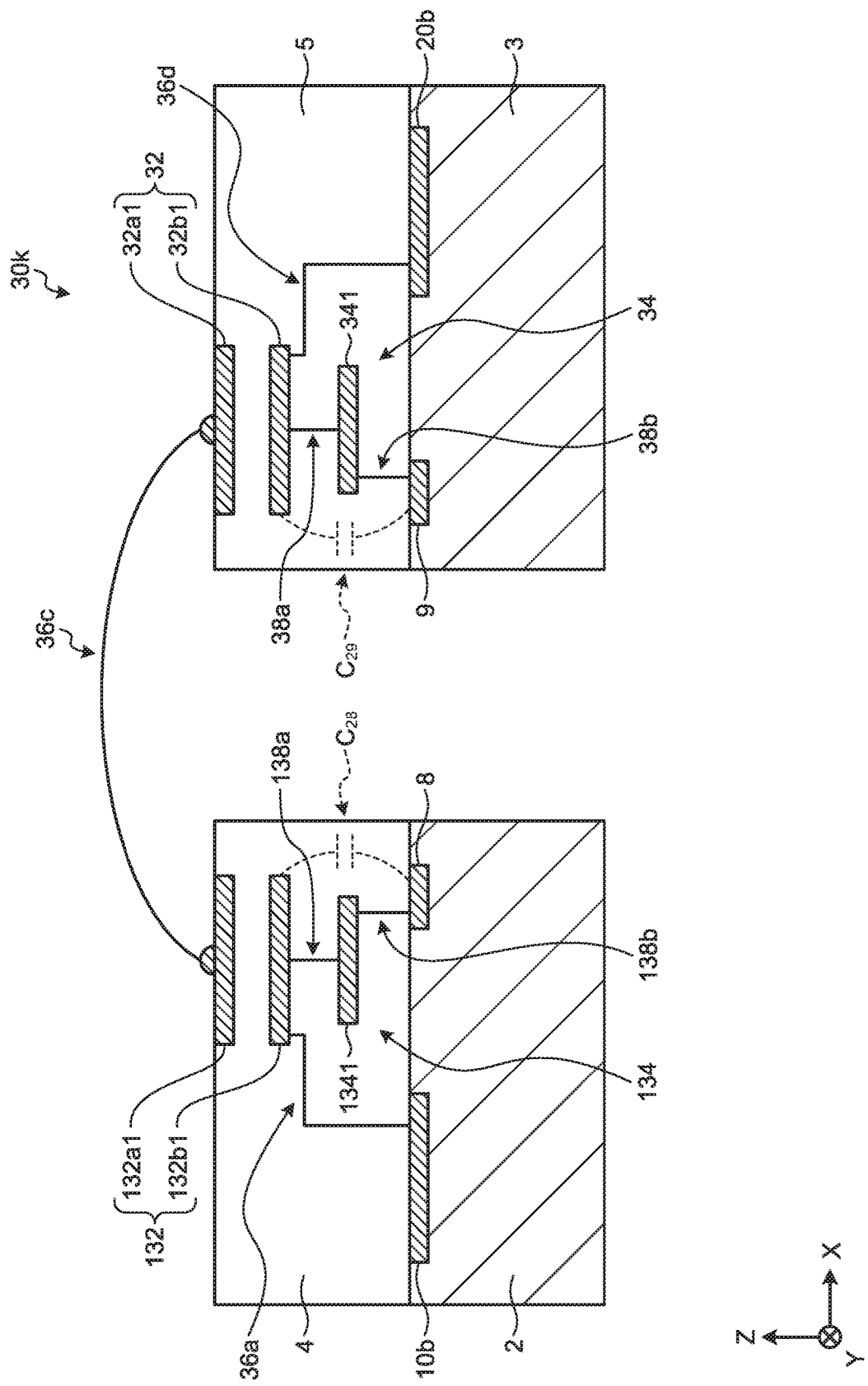
FIG. 10 is a cross-sectional view illustrating the mounting configuration of the isolator according to the second modified example of the embodiment.

The isolator 30k illustrated in FIG. 8 may be mounted as illustrated in, for example, FIGS. 9 and 10. FIG. 9 is a cross-sectional view illustrating a mounting configuration of the isolator 30k and illustrates cross sections corresponding to the capacitive element 131 and the inductive element 133. FIG. 10 is a cross-sectional view illustrating the mounting configuration of the isolator 30k and illustrates cross sections corresponding to the capacitive element. 132 and the inductive element 134. In FIGS. 9 and 10, the direction perpendicular to the surface of the substrate 2 is defined as the Z direction, and the two directions orthogonal to each other in the plane perpendicular to the Z direction are defined as the X direction and the Y direction.

The capacitive element 131 illustrated in FIG. 9 is disposed in the +Z direction of the substrate 2 through the interlayer insulating film 4. The capacitive element 131 has an electrode 131a1 and an electrode 131b1. The electrode 131a1 is disposed in the +Z direction of the electrode 131b1 and faces the electrode 131b1 through the interlayer insulating film 4. The electrode 131a1 functions as one end 131a (refer to FIG. 8) of the capacitive element 131. The electrode 131b1 functions as the other end 131b of the capacitive element 131. The electrode 131b1 is electrically connected to the electrode 10a through the wiring 35a.

The capacitive element 131 may be configured as a parallel plate type (refer to FIG. 4) with respect to the electrode 131a1 and the electrode 131b1. Each of the electrode 131a1 and the electrode 131b1 is configured in a plate shape, and the electrode 131a1 and the electrode 131b1 may be disposed to face each other. The electrode 131a1 may be configured in a rectangular shape in the XY plan view. The electrode 131a2 may be configured in a rectangular shape in the XY plan view.

The inductive element 133 is disposed between the substrate 2 and the capacitive element 131 in the Z direction. The inductive element 133 has a coil pattern 1331. The coil pattern 1331 is disposed between the ground pattern 6 and the capacitive element 131 in the Z direction. The coil pattern 1331 extends in the X and Y directions. One end of the coil pattern. 1331 is electrically connected to the electrode 131b1 through wiring 137a, and the other end is electrically connected to the ground pattern 6 through wiring 137b.

The coil pattern 1331 can have a configuration of a spiral type (refer to FIG. 4). The coil pattern 1331 can be configured to extend in a spiral shape in the X and Y directions. A portion of the coil pattern 1331 in the vicinity of the center thereof is electrically connected to the electrode 131b1 through the wiring 137a, and a portion on the outer peripheral side thereof is electrically connected to the ground pattern 6 through the wiring 137b.

The capacitive element 132 illustrated in FIG. 10 is disposed in the +Z direction of the substrate 2 through the interlayer insulating film 4. The capacitive element 132 has an electrode 132a1 and an electrode 132b1. The electrode 132a1 is disposed in the +Z direction of the electrode 132b1 and faces the electrode 132b1 through the interlayer insulating film 4. The electrode 132a1 functions as one end 132a of the capacitive element 132. The electrode 132b1 functions as the other end 132b of the capacitive element 132. The electrode 132b1 is electrically connected to the electrode 10b through the wiring 36a.

The capacitive element 132 may be configured as a parallel plate type (refer to FIG. 4) with respect to the electrode 132a1 and the electrode 132b1. Each of the electrode 132a1 and the electrode 132b1 is configured in a plate shape, and the electrode 132a1 and the electrode 132b1 may be disposed to face each other. The electrode 132a1 may be configured in a rectangular shape in the XY plan view. The electrode 132a2 may be configured in a rectangular shape in the XY plan view.

The inductive element 134 is disposed between the substrate 2 and the capacitive element 132 in the Z direction. The inductive element. 134 has a coil pattern 1341. The coil pattern 1341 is disposed between the ground pattern 8 and the capacitive element 132 in the Z direction. The coil pattern 1341 extends in the X and Y directions. One end of the coil pattern 1341 is electrically connected to the electrode 132b1 through wiring 138a, and the other end is electrically connected to the ground pattern 8 through wiring 138b.

The coil pattern 1341 may be configured as a spiral type (refer to FIG. 4). The coil pattern 1341 can be configured to extend in a spiral shape in the X and Y directions. A portion of the coil pattern 1341 in the vicinity of the center thereof is electrically connected to the electrode 132b1 through the wiring 138a, and a portion on the outer peripheral side thereof is electrically connected to the ground pattern 8 through the wiring 138b.

In addition, the coil pattern 1331 and the coil pattern 1341 can be configured in spiral shapes reversely winding with each other (refer to FIG. 4). As a result, it is possible to suppress the magnetic influence of the coil pattern 1331 and the coil pattern 1341 mutually.

Herein, as illustrated in FIG. 9, the electrode 131b1 of the capacitive element 131 may form a parasitic ground capacitance $C_{16}$ between the electrode 131b1 and the ground pattern 6. At this time, if it is assumed that the frequency or a signal (differential P-side signal) to be transmitted from the transmission circuit 40 to the reception circuit 50 through the capacitive element 131 is denoted by $f_P$, an inductance $L_{133}$ of the inductive element. 133 may be determined so as to be expressed by the following Equation 3.

$$L_{133}=1/(4\pi^2 f_P^2 C_{16}) \qquad \text{Equation 3}$$

With this configuration, a circuit including the inductive element 133 and the ground capacitance $C_{16}$ can be set to be in an equivalently opened state with respect to a signal having the frequency $f_P$. As a result, since a signal transmitted from the electrode 131b1 side (the node N11 side illustrated in FIG. 8) to the inductive element 133 side can be reflected to the electrode 131b1 side (the node N11 side), the influence of the parasitic ground capacitance $C_{16}$ can be suppressed, and the transmission loss of the signal to the reception circuit 50 can be reduced.

In addition, as illustrated in FIG. 10, the electrode 132b1 of the capacitive element 132 may form a parasitic ground capacitance $C_{28}$ between the electrode 132b1 and the ground pattern 8. At this time, if it is assumed that the frequency of a signal (differential N-side signal) to be transmitted from the transmission circuit 40 to the reception circuit 50 through the capacitive element 132 is denoted by $f_N$, an inductance $L_{134}$ of the inductive element 134 may be determined so as to be expressed by the following Equation 4.

$$L_{134}=1/(4\pi^2 f_N^2 C_{28}) \qquad \text{Equation 4}$$

With this configuration, a circuit including the inductive element 134 and the ground capacitance $C_{28}$ can be set to be in an equivalently opened state with respect to a signal having the frequency $f_N$. As a result, since a signal transmitted from the electrode 132b1 side (the node N12 side illustrated in FIG. 8) to the inductive element 134 side can be reflected to the electrode 132b1 side (the node N12 side), the influence of the parasitic ground capacitance $C_{28}$ can be suppressed, and the transmission loss of the signal to the reception circuit 50 can be reduced.

Figure 11:
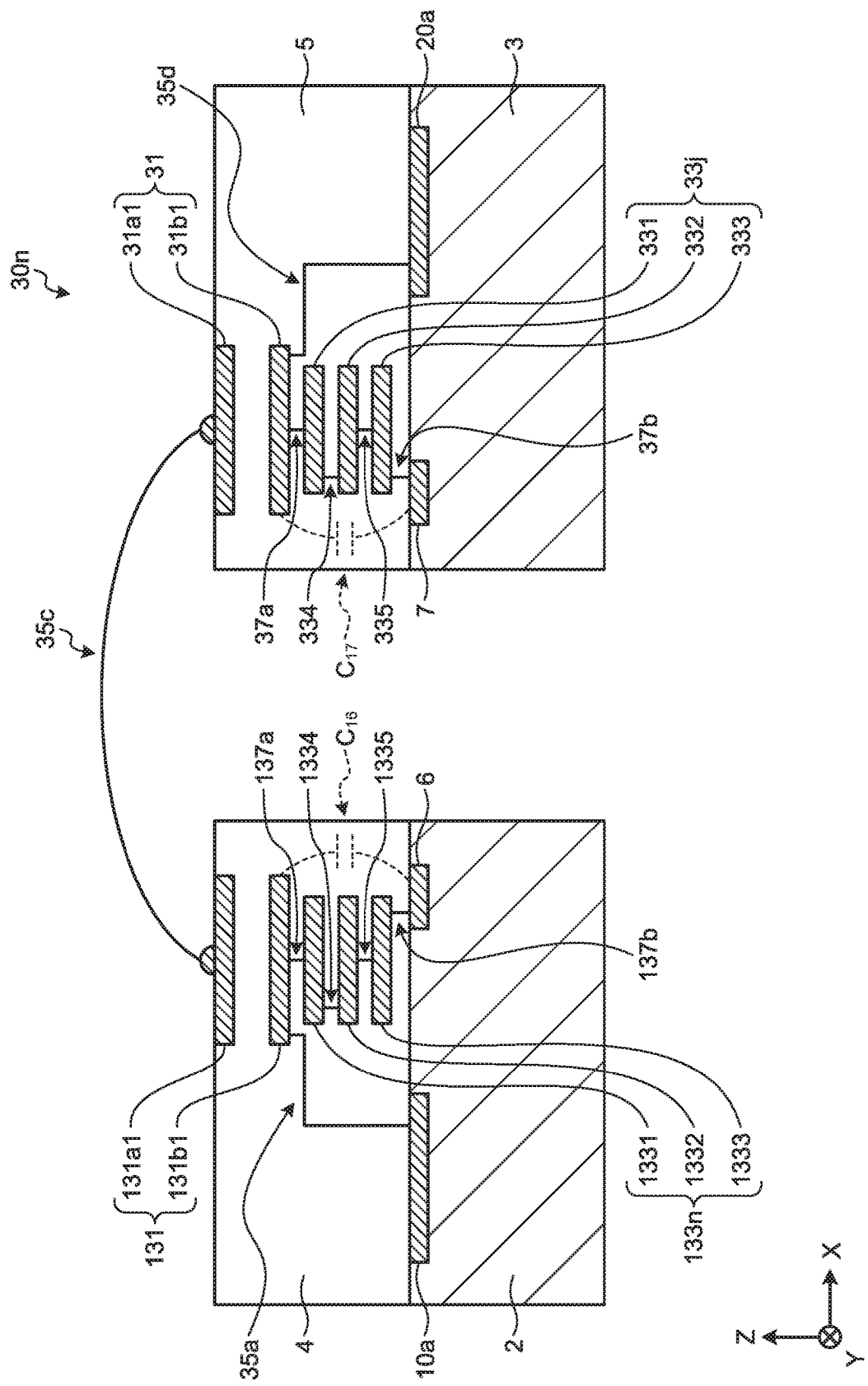
FIG. 11 is a cross-sectional view illustrating a mounting configuration of an isolator according to a third modified example of the embodiment.
Figure 12:
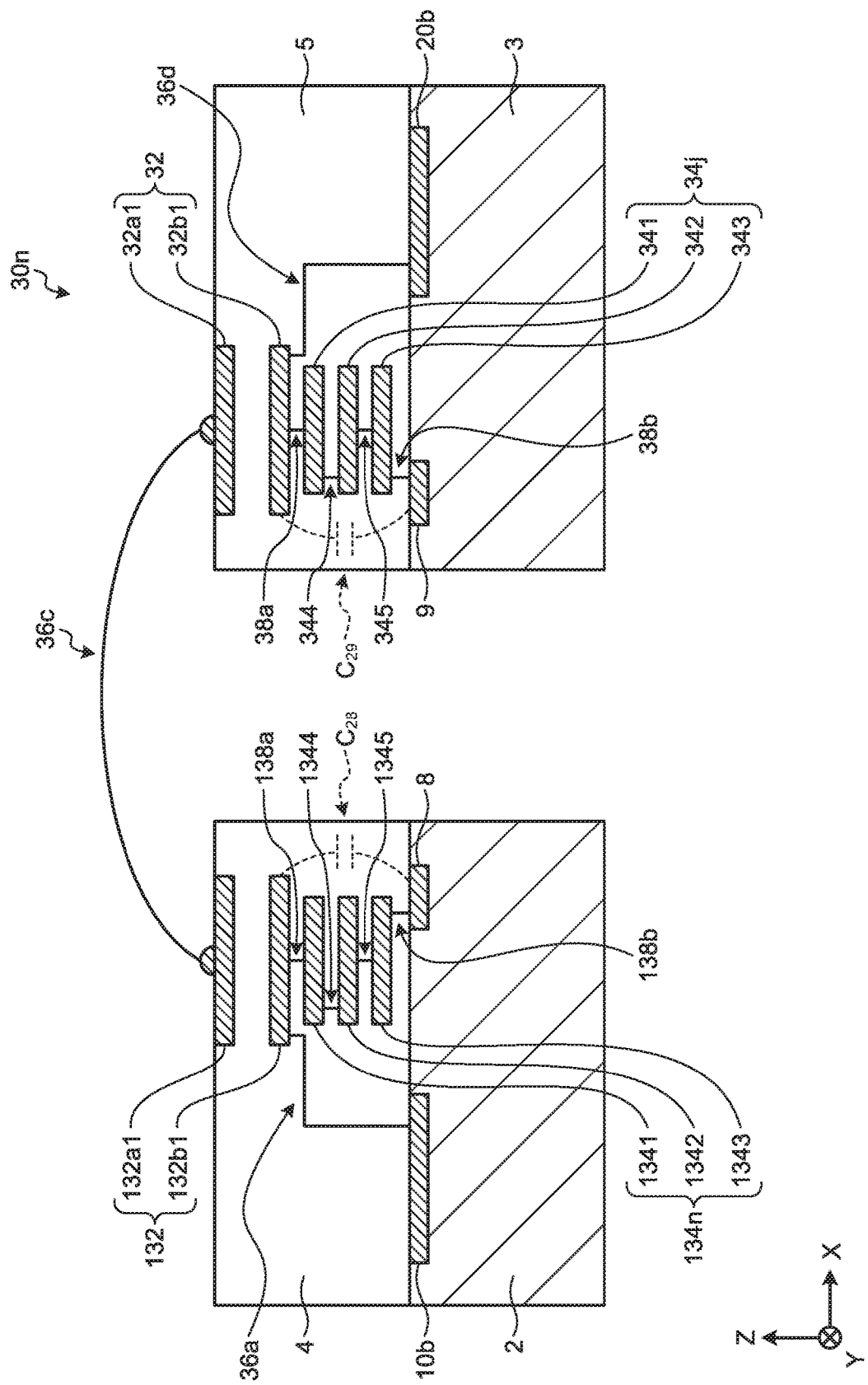
FIG. 12 is a cross-sectional view illustrating the mounting configuration of the isolator according to the third modified example of the embodiment.

Alternatively, in an isolator 30n, as illustrated in FIGS. 11 and 12, the inductive elements 133n and 134n may have a stacked structure. FIG. 11 is a cross-sectional view illustrating a mounting configuration of the isolator 30n and illustrates cross sections corresponding to the capacitive element 131 and the inductive element 133n. FIG. 12 is a cross-sectional view illustrating the mounting configuration of the isolator 30n and illustrates cross sections corresponding to the capacitive element 132 and the inductive element 134n. In FIGS. 11 and 12, the direction perpendicular to the surface of the substrate 2 is defined as the Z direction, and the two directions orthogonal to each other in the plane perpendicular to the Z direction are defined as the X direction and the Y direction.

The inductive element 133n illustrated in FIG. 11 further includes a coil pattern 1332, a coil pattern 1333, wiring 1334, and wiring 1335 in addition to the coil pattern 1331.

The coil pattern 1332 is disposed between the ground pattern 6 and the coil pattern 1331 in the Z direction and is disposed between the coil pattern 1333 and the coil pattern 1331 in the Z direction. The coil pattern 1332 extends in the X and Y directions. One end of the coil pattern 1332 is electrically connected to the other end of the coil pattern 1331 through the wiring 1334, and the other end is electrically connected to one end of the coil pattern 1333 through the wiring 1335.

The coil pattern 1333 is disposed between the ground pattern 6 and the coil patterns 1331 and 1332 in the Z direction. The coil pattern 1333 extends in the X and Y directions. One end or the coil pattern 1333 is electrically connected to the other end of the coil pattern 1332 through the wiring 1335, and the other end is electrically connected to the ground pattern 6 through the wiring 137b.

The plurality of coil patterns 1331 to 1333 can have a stacked structure in which a spiral configuration is stacked. (refer to FIG. 7).

The coil pattern 1331 can be configured to extend in a spiral shape in the X and Y directions. A portion of the coil pattern 1331 in the vicinity of the center thereof is electrically connected to the electrode 131b1 through the wiring 137a, and a portion on the outer peripheral side thereof is electrically connected to the coil pattern 1332 through the wiring 1334.

The coil pattern 1332 can be configured to extend in a spiral shape in the X and Y directions. A portion of the coil pattern 1332 on the outer peripheral side thereof is electrically connected to the coil pattern 1331 through the wiring 1334, and a portion in the vicinity of the center thereof is electrically connected to the coil pattern 1333 through the wiring 1335.

The coil pattern 1333 can be configured to extend in a spiral shape in the X and Y directions. A portion of the coil pattern 1333 in the vicinity of the center thereof is electrically connected to the coil pattern 1332 through the wiring 1335, and a portion on the outer peripheral side thereof is electrically connected to the ground pattern 6 through the wiring 137b.

The inductive element 134n illustrated in FIG. 6 further includes a coil pattern 1342, a coil pattern 1343, wiring 1344, and wiring 1345 in addition to the coil pattern 1341.

The coil pattern 1342 is disposed between the ground pattern 9 and the coil pattern 1341 in the Z direction and is disposed between the coil pattern 1343 and the coil pattern 1341 in the Z direction. The coil pattern 1342 extends in the X and Y directions. One end of the coil pattern 1342 is electrically connected to the other end of the coil pattern 1341 through the wiring 1344, and the other end is electrically connected to one end of the coil pattern 1343 through the wiring 1345.

The coil pattern 1343 is disposed between the ground pattern 9 and the coil pattern 1341 in the Z direction and is disposed between the ground pattern 9 and the coil pattern 1342 in the Z direction. The coil pattern 1343 extends in the X and Y directions. One end of the coil pattern 1343 is electrically connected to the other end of the coil pattern 1342 through the wiring 1345, and the other end is electrically connected to the ground pattern 9 through the wiring 138b.

The plurality of coil patterns 1341 to 1343 illustrated in FIG. 6 may be configured as a stacked structure as illustrated in FIG. 7.

The coil pattern 1341 can be configured to extend in a spiral shape in the X and Y directions. A portion of the coil pattern 1341 in the vicinity of the center thereof is electrically connected to the electrode 131b1 through the wiring 138a, and a portion on the outer peripheral side thereof is electrically connected to the coil pattern 1342 through the wiring 1344.

The coil pattern 1342 can be configured to extend in a spiral shape in the X and Y directions. A portion of the coil pattern 1342 on the outer peripheral side thereof is electrically connected to the coil pattern 1341 through its wiring 1344, and a portion in the vicinity of the center thereof is electrically connected to the coil pattern 1343 through the wiring 1345.

The coil pattern 1343 can be configured to extend in a spiral shape in the X and Y directions. A portion of the coil pattern 1343 in the vicinity of the center thereof is electrically connected to the coil pattern 1342 through the wiring 1345, and a portion on the outer periphery side thereof is electrically connected to the ground pattern 9 through the wiring 138b.

In this manner, by mounting the inductive elements 133n and 134n in the isolator 30n with a stacked structure, it is possible to efficiently secure the inductance per unit area in the X and Y directions. As a result, it is possible to reduce the mounting area of the coil patterns 1331 to 1333 and 1341 to 1343 in the X and Y directions for obtaining the inductances 1133 and 1134 expressed by, for example, Equations 3 and 4, so that it is possible to easily improve the mounting density of the isolators 30n.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An isolator comprising:
   a first signal line disposed between an input side circuit and an output side circuit;
   a second signal line disposed between the input side circuit and the output side circuit and constituting a differential pair with the first signal line;
   a first capacitive element arranged on the first signal line, the first capacitive element having one end electrically connected to the input side circuit and having another end electrically connected to the output side circuit;
   a second capacitive element arranged on the second signal line, the second capacitive element having one end electrically connected to the input side circuit and having another end electrically connected to the output side circuit;
   a first inductive element having one end electrically connected to a first node between the first capacitive element in the first signal line and the output side circuit; and
   a second inductive element having one end electrically connected to a second node between the second capacitive element in the second signal line and the output side circuit,
   wherein the first capacitive element is disposed above a substrate,
   the first inductive element is disposed between the substrate and the first capacitive element, the first inductive element having a stacked structure,
   the second capacitive element is disposed above the substrate, and
   the second inductive element is disposed between the substrate and the second capacitive element, the second inductive element having a stacked structure,
   the isolator further comprising a ground pattern disposed on the substrate,
   wherein the first inductive element has
     a first coil pattern disposed between the ground pattern and the first capacitive element, and
     a third coil pattern disposed between the ground pattern and the first coil pattern the second inductive element has
     a second coil pattern disposed between the ground pattern and the second capacitive element, and
     a fourth coil pattern disposed between the ground pattern and the second coil pattern.

2. The isolator according to claim 1,
   wherein the other end of the first inductive element is electrically connected to the ground pattern, and
   the other end of the second inductive element is electrically connected to the ground pattern.

3. The isolator according to claim 1, wherein
each of the first coil pattern and the second coil pattern extends in a spiral shape in a planar direction.

4. The isolator according to claim 3, wherein
the first coil pattern and the second coil pattern extend in spiral shapes reversely winding with each other.

5. The isolator according to claim 1,
wherein the first capacitive element has a pair of first electrodes,
the second capacitive element has a pair of second electrodes,
the first electrode is formed from a material containing a first metal,
the first coil pattern is formed from a material containing a second metal,
the second electrode is formed from a material containing the first metal, and
the second coil pattern is formed from a material containing the second metal.

6. The isolator according to claim 1,
wherein the number of the third coil patterns and the number of the fourth coil patterns are one or more, respectively,
the third coil patterns have a stacked structure and the fourth coil patterns have a stacked structure.

7. The isolator according to claim 1,
wherein the first coil pattern and the third coil pattern are electrically connected to each other, and
the second coil pattern and the fourth coil pattern are electrically connected to each other.

8. The isolator according to claim 1,
wherein each of the first coil pattern and the second coil pattern extends in a spiral shape in a planar direction, and
each of the third coil pattern and the fourth coil pattern extends in a spiral shape in a planar direction.

9. The isolator according to claim 8,
wherein the first coil pattern and the second coil pattern extend in spiral shapes reversely winding with each other, and
the third coil pattern and the fourth coil pattern extend in spiral shapes reversely winding with each other.

10. The isolator according to claim 1, further comprising:
a third capacitive element arranged between the input side circuit and the first capacitive element on the first signal line, the third capacitive element having one end electrically connected to the input side circuit and having another end electrically connected to the one end of the first capacitive element;
a fourth capacitive element arranged between the input side circuit and the second capacitive element on the second signal line, the fourth capacitive element having one end electrically connected to the input side circuit and having another end electrically connected to the one end of the second capacitive element;
a third inductive element having one end electrically connected to a third node between the input side circuit and the third capacitive element in the first signal line; and
a fourth inductive element having one end electrically connected to a fourth node between the input side circuit and the fourth capacitive element in the second signal line.

11. The isolator according to claim 10,
wherein the other end of the first inductive element is electrically connected to the ground potential,
the other end of the second inductive element is electrically connected to the ground potential,
the other end of the third inductive element is electrically connected to the ground potential, and
the other end of the fourth inductive element is electrically connected to the ground potential.

* * * * *